(12) United States Patent
Endo et al.

(10) Patent No.: US 7,446,016 B2
(45) Date of Patent: Nov. 4, 2008

(54) METHOD FOR PRODUCING BONDED WAFER

(75) Inventors: Akihiko Endo, Tokyo (JP); Nobuyuki Morimoto, Tokyo (JP)

(73) Assignee: SUMCO Corporation, Tokyo (JP)

( * ) Notice: Subject to any disclaimer, the term of this patent is extended or adjusted under 35 U.S.C. 154(b) by 52 days.

(21) Appl. No.: 10/570,663

(22) PCT Filed: Sep. 8, 2004

(86) PCT No.: PCT/JP2004/013069

§ 371 (c)(1),
(2), (4) Date: Mar. 6, 2006

(87) PCT Pub. No.: WO2005/024917

PCT Pub. Date: Mar. 17, 2005

(65) Prior Publication Data

US 2006/0281280 A1    Dec. 14, 2006

(30) Foreign Application Priority Data

Sep. 8, 2003    (JP)    ............................. 2003-315988

(51) Int. Cl.
   *H01L 21/30*    (2006.01)
(52) U.S. Cl. ............... 438/455; 438/458; 257/E21.568; 257/E21.57
(58) Field of Classification Search ................ 438/455, 438/458; 257/E21.568, E21.57, E21.499
   See application file for complete search history.

(56) References Cited

U.S. PATENT DOCUMENTS

| 5,374,564 | A | | 12/1994 | Bruel |
| 5,882,987 | A | * | 3/1999 | Srikrishnan ............... 438/458 |
| 6,150,239 | A | | 11/2000 | Goesele et al. |
| 6,284,628 | B1 | | 9/2001 | Kuwahara et al. |
| 2001/0029072 | A1 | * | 10/2001 | Kuwahara et al. ........... 438/151 |

FOREIGN PATENT DOCUMENTS

| JP | 5-211128 | 8/1993 |
| JP | 2-267195 | 5/1996 |
| JP | 11-121377 | 4/1999 |
| JP | 11-307413 | 11/1999 |
| JP | 2000-49063 | 2/2000 |
| JP | 2003-142668 | 5/2003 |
| JP | 2003-524876 | 8/2003 |

OTHER PUBLICATIONS

English Language Abstract of JP 2-267195.
English Language Abstract of JP 2000-49063.

(Continued)

*Primary Examiner*—Hsien-ming Lee
(74) *Attorney, Agent, or Firm*—Greenblum & Bernstein, P.L.C.

(57) ABSTRACT

A bonded SOI substrate having an active layer which is free from crystal defects is obtained by adding more than $9 \times 10^{18}$ atoms/cm$^3$ of boron to a wafer for active layer (10). Since the boron concentration in the wafer for active layer is high, a silicon oxide film is formed at a high rate. Consequently, there can be obtained a Smart-Cut wafer with high throughput. Furthermore, damages to the active layer due to the ion implantation can be reduced, thereby improving the quality of the active layer.

5 Claims, 2 Drawing Sheets

OTHER PUBLICATIONS

U.S. Appl. No. 10/570,665 to Endo et al., filed on Mar. 6, 2006.
U.S. Appl. No. 10/570,669 to Endo et al., filed on Mar. 6, 2006.
U.S. Appl. No. 10/569,942 to Endo et al., filed on Feb. 28, 3006.
U.S. Appl. No. 10/570,668 to Endo et al., filed on Mar. 6, 2006.
U.S. Appl. No. 10/570,353 to Morimoto et al., filed on Mar. 3, 2006.
U.S. Appl. No. 10/570,354 to Morimoto et al., filed on Mar. 3, 2006.
English Language Abstract of JP 2003-142668.

* cited by examiner

Fig. 1

METHOD FOR PRODUCING BONDED WAFER

FIELD OF THE INVENTION

The present invention related to a method for producing a bonded wafer, and more particularly to technology for producing a bonded wafer of high quality that includes no such crystal defect as COP in an active layer wafer by using the smart cut method.

DESCRIPTION OF THE PRIOR ART

Recently, the smart cut method as disclosed in the Patent Document 1 has been developed as a method for producing a semiconductor substrate having an SOI (Silicon On Insulator) structure.

In the smart cut method, firstly a wafer for active layer, which has been processed to have an oxide film formed thereon and then ion-implanted with hydrogen at a predetermined depth thereof via the oxide film, is bonded with a supporting wafer at a room temperature, and secondly, thus obtained bonded wafer is introduced into a furnace for heat treatment to thereby cleave and separate a part of the active layer wafer at the site of the ion-implanted area. This can produce a bonded SOI substrate comprising the supporting wafer and the active layer wafer with a buried silicon oxide film interposed therebetween.

By the way, in conjunction with highly densified integration of MOS-type devices in a recent trend, a gate oxide film thickness has been reduced and so a source, a drain and the like have been made shallower. Owing to this situation, there is a strong demand for improving a withstand voltage property of a gate oxide film and for reducing a junction leak current. However, the silicon growing rate in pull-up of a monocrystal ingot of silicon by using the CZ method has been as high rate as 1.0 mm/min to 2.0 mm/min. Owing to this, there could be observed a large number of crystal defects, including COP (Crystal Originated Particle) and OSF (Oxidation Induced Stacking Fault), observed in a silicon wafer that has been produced by slicing the ingot as mentioned above (hereinafter referred to as a high-rate pull-up wafer). This is because a complicated reaction could be induced by interstitial silicon, vacancy and oxygen, which have been taken in during the pulling up of the crystal, in dependence on a thermal history during cooling process. As a result, the withstand voltage property of the gate oxide film could be deteriorated, making it difficult to accommodate the further densified integration of the MOS-type devices in a current trend.

There has been known a technology as disclosed in the Patent Document 2, for example, as a prior art method for solving the above problems. The Patent Document 2 has suggested that a monocrystal ingot of silicon is grown by using a pulling-up rate of 0.8 mm/min or lower in the CZ method. The growing of the silicon at the low rate permits the interstitial silicon and the vacancy that have been taken in at the site of pulling-up interface to destroy each other and thus the density of COP, or an aggregation of vacancy, to be decreased or annihilated, and accordingly this reduced density of the vacancy essential for oxygen deposition makes it difficult for the oxygen deposition to take effect in the monocrystal ingot of silicon.

[Patent Document 1]
Japanese Patent Laid-open Publication No. Hei5-211128
[Patent Document 2]
Japanese Patent Laid-open Publication No. Hei2-267195

SUMMARY OF THE INVENTION

Problem to be Solved by the Invention

To address this, it is contemplated that the technology for producing such a silicon wafer that has been pulled up at a lower rate (hereinafter referred to as a low-rate pull-up wafer) can be applied to the smart cut method. Specifically, the low-rate pull-up wafer can be used for an active layer wafer of a bonded SOI substrate produced in the smart cut method. If so, such a bonded SOI substrate having no crystal defect including the COP present in the active layer can be obtained.

However, if the low-rate pull-up wafer is used, the pulling up of the wafer requires a longer time as compared to the high-rate pull-up wafer, deteriorating a yield thereof. Consequently, it could lead to a cost increase for manufacturing the bonded SOI substrate.

In addition, for example, in a practice according to the prior art in which an active layer wafer of p-type having a boron concentration around $1 \times 10^{16}$ atmos/cm$^3$ is introduced into a furnace for thermal oxidation thereby to form a silicon oxide film in the active layer wafer, a rate of silicon oxide film formation is typically of the order of $4\sim5\times10^{-4}$ μm/min (a heating temperature of 1000° C.: dry oxygen oxidation). As a result, the formation of a buried silicon oxide film has been time-consuming.

Further, when hydrogen is ion-implanted into the active layer wafer during the ion implantation, a damage from the ion implantation has occurred in the active layer wafer to thereby deteriorate the quality of the active layer.

An object of the present invention is to provide a bonded wafer and a method for producing the same bonded wafer by employing the smart cut method allowing for a bonded wafer having an active layer including no crystal defect existing therein to be produced at a low cost and a high throughput, wherein a damage to an active layer from the ion implantation can be reduced so as to provide high quality of active layer and a time required for formation of a buried insulating film can be also shortened.

Means to Solve the Problem

A first invention provides a method for producing a bonded wafer, comprising:
 an epitaxial growth step for growing an epitaxial layer containing boron in a wafer for active layer;
 an insulating film formation step for forming an insulating film in a surface of the epitaxial layer;
 an ion implantation step, following the insulation film formation, for ion-implanting of a light element into the epitaxial layer at a predetermined depth to thereby form an ion-implanted area therein;
 a bonding step, following the ion implantation, for bonding said active layer wafer and a supporting wafer together with the insulating film interposed therebetween to thereby form a bonded wafer; and
 a cleavage and separation step for heat treating the bonded wafer to cause bubbles of light element to be generated in the ion-implanted area and thereby a part of said active layer wafer to be cleaved and separated at the site of the predetermined depth for forming an active layer.

According to the first invention, when the bonded wafer is subjected to the heat treatment for cleavage, the bubbles of light element are formed within the ion-implanted area of the epitaxial layer. With the aid of this, the cleavage and separation takes effect, so that the active layer constituting a part of the epitaxial layer is left via the buried insulating film in the supporting wafer side but the rest of the epitaxial layer can be cleaved and separated along with the active layer wafer. Therefore, the active layer turned to be a layer obtained through the epitaxial growth with no presence of crystal defect.

As a result, it becomes possible in the production of the bonded wafer by employing the smart cut method to produce such a bonded wafer having the active layer containing no crystal defect by using a high-rate pull-up wafer that can provide a higher throughput and a higher yield than a low-rate pull-up wafer of the prior art. Further advantageously, for example, if an oxide film is formed for insulating film on top of the epitaxial layer, the higher concentration of p-type impurities (boron) in the epitaxial layer can increase the rate of formation of the oxide film.

This is due to the following reasons. Firstly, oxidizing species of $O_2$ or $H_2O$ react with the silicon in the surface of the epitaxial layer to form the oxide film. The boron in the silicon segregates within the formed oxide film. In this regard, the boron in the oxide film serves for weakening the bond in $SiO_2$ mesh structure. This facilitates the diffusion of the oxidizing species ($O_2$ or $H_2O$) and thus increases the oxidation rate. Consequently, this can further increase the throughput in the insulating film formation of the wafer.

Besides, if the epitaxial layer is added with the p-type impurities at a high concentration, the Fermi level approaches to a conduction band or a valence band by the doping, and the generation of charged vacancy and the generation of kink site are stimulated, respectively, thereby increasing the number of site serving for capturing the silicon atoms in the area of silicon (amorphous layer) that has been damaged by the ion-implantation. This can accelerate the recovery (recrystallization) at the crystal defect in the epitaxial layer resultant from the ion implantation of hydrogen more effectively in the subsequent additional heat treatment in comparison to the case of the epitaxial layer that has been doped with the p-type impurities at a low concentration of doping. As a result, the damage to the active layer from the ion implantation can be reduced, so that the high quality of active layer can be obtained. Although the substrate on which the epitaxial layer containing the born at a high concentration comprises a silicon wafer, the specific resistance (the dopant concentration) of the silicon wafer is not limited. It is however noted that as the difference of dopant concentration between the epitaxial layer and the substrate becomes greater, there is possibly a chance for misfit dislocation to occur, which will be caused by the mismatching of lattice constant, and so it is more preferred from this fact that the specific resistance should be substantially equal between the epitaxial layer and the substrate.

The active layer wafer is a silicon wafer.

The insulating film may employ an oxide film, for example.

The thickness of the insulating film is not limited, so far as it is thinner than the epitaxial layer. For example, the thickness of the insulating film may be 0.2μm or thinner, preferably in a range of 0.1 μm to 0.2 μm.

The thickness of the active layer is not limited. For example, the thickness of the active layer of thick film may be in a range of 1 μm to 10 μm. The thickness of the active layer of thin film may be in a range of 0.01 μm to 1 μm.

An epitaxial growth system used for growing the epitaxial layer in the active layer wafer is not limited to specific ones. For example, a vapor phase epitaxial growth system may be employed. The vapor phase epitaxial growth system may include, for example, a single wafer processing type epitaxial growth system allowing for the epitaxial growth of the active layer wafer on one by one basis. Alternatively, the epitaxial growth system may be of batch processing type operable for processing a plurality of active layer wafers at one time.

A source gas may employ, for example, $SiH_4$, $SiH_2Cl_2$, $SiHCl_3$, $SiCl_4$ and the likes.

A carrier gas may employ hydrogen gas, an inactive gas and the like.

A heater means for heating the interior of the furnace in the vapor phase epitaxial growth system may employ, for example, a halogen lamp, an infrared lamp and so on.

The p-type impurities contained in the active layer wafer and the epitaxial layer may employ, for example, boron.

The concentration of the impurities in the active layer wafer is not limited.

The light element may be a type of noble gas, including, for example, helium (He), neon (Ne), argon (Ar), krypton (Kr), xenon (Xe) and radon (Rn), in addition to the hydrogen (H). Those elements may be provided in a single element or as a component of a chemical compound.

The dose of the light element for the ion implantation is not limited. For example, the dose may be in a range of $2 \times 10^{16}$ atoms/cm$^2$ to $8 \times 10^{16}$ atoms/cm$^2$.

The acceleration voltage of the light element during the ion implantation may be not higher than 50 keV, preferably not higher than 30 keV and more preferably not higher than 20 keV. In the ion implantation, using the lower acceleration voltage allows the ion to be controlled more precisely such that the ion can be concentrated in a depth of target.

The heating temperature of the bonded wafer during the cleavage process may be 400° C. or higher, preferably in a range of 400° C. to 700° C. and more preferably in a range of 450° C. to 550° C. It is difficult with the temperature lower than 400 ° C. to form the bubbles of light element from the light element which has been ion-implanted into the active layer. Inversely, with the temperature higher than 700° C., the oxide deposit will be formed within the active layer and it may deteriorate the properties of devices.

The atmosphere within the furnace during the cleavage process may be the atmosphere of non-oxidizing gas (e.g., an inactive gas such as nitrogen, argon). Alternatively, the process may be carried out in a vacuum condition.

The heating time of the bonded wafer for the cleavage may be one minute or longer, preferably in a range of 10 minutes to 60 minutes. With the heating time less than one minute, it is difficult to form the bubbles of light element which has been ion-implanted into the bonded wafer.

Following the step of cleavage, the bonded wafer may be subjected to the heat treatment for bonding in order to enhance the bonding strength between the active layer wafer and the supporting wafer. The condition for this heat treatment may be defined by a heat treatment at 1100° C. for two hours, for example. The atmospheric gas in the furnace for thermal oxidation may employ oxygen and the like.

A second invention provides a method for producing a bonded wafer as defined in the first invention, in which a concentration of boron contained in the epitaxial layer is $5 \times 10^{18}$ atoms/cm$^3$ or higher.

According to the second invention, the boron concentration below $5 \times 10^{18}$ atoms/cm$^3$ in the epitaxial layer could reduce the effect of improving the oxide film growing rate and the effect of recovering the ion implantation damaged area. A preferred boron concentration in the epitaxial layer may be in a range of $8 \times 10^{18}$ atoms/cm$^3$ to $2 \times 10^{19}$ atoms/cm$^3$.

A third invention provides a method for producing a bonded wafer as defined in the first or the second invention, in which a thickness of the epitaxial layer is 0.3 μm or thicker.

According to the third invention, if the epitaxial layer is thinner than 0.3 μm in thickness, the COP present in the active layer wafer could not be buried satisfactorily with such an epitaxial layer but a recess might be left in the surface of the epitaxial layer. In addition, the epitaxial layer thinner than 0.3 µm in thickness could not form the insulating film (oxide film) of predetermined thick (of the order of 0.2 µm) in the active layer wafer including the epitaxial layer.

Inversely, too thick epitaxial layer may lead to the cost increase for forming such an epitaxial layer. A preferred thickness of the epitaxial layer for an SOI of thin film may be in a range of 0.5 µm to 1.5 µm, and that for the SOI of thick film may be in a range of 1 µm to 2 µm. It is more preferred to further apply an epitaxial film deposition after the construction of the SOI structure.

A fourth invention provides a method for producing a bonded wafer as defined in any one of the first to the third inventions, in which the ion-implanted area is formed in the epitaxial layer.

A fifth invention provides a method for producing a bonded wafer as defined in anyone of the first to the fourth inventions, in which a thickness of the insulating film is thinner than 0.2 µm.

According to the fifth invention, the thickness of the insulating film is thinner than 0.2 µm. With the thickness of 0.2 µm or thicker, it is impossible to form the ion-implanted area in the epitaxial layer.

A sixth invention provides a method for producing a bonded wafer, comprising:

an ion-implantation step for ion-implanting of a light element into a wafer for active layer at a predetermined depth to thereby form an ion-implanted area therein, said active layer wafer comprising an insulating film formed thereon and containing boron at a concentration of $9 \times 10^{18}$ atoms/cm$^3$ or higher and oxygen at a concentration below $12 \times 10^{17}$ atmos/cm$^3$ (old ASTM);

a bonding step for subsequently bonding the active layer wafer that has been subjected to the ion implantation and a supporting wafer together with the insulating film interposed therebetween to thereby form a bonded wafer; and a cleavage and separation step for heat treating the bonded wafer to cause bubbles of light element to be generated in the ion-implanted area and thereby a part of the active layer wafer to be cleaved and separated at the site of the predetermined depth for forming an active layer.

According to the sixth invention, during the pulling-up of the ingot (e.g., the monocrystal ingot of silicon) for the active layer wafer, the boron is contained in the crystal by an amount greater than $9 \times 10^{18}$ atoms/cm$^3$. Owing to this, there is no presence of crystal defect in the ingot during the pulling-up. This is because the silicon lattice is compressed as it is doped with the boron having the small atomic size in association with an increase in concentration of boron, and the interstitial silicon is then increased in order to mitigate the compression. Consequently, the thermal equilibrium concentration of the interstitial silicon is increased to be higher in comparison to the concentration of vacancy, and so there is no more area to be occupied by the excessive vacancies which could lead to the COP.

During cleavage, the bubbles of light element are formed in the ion-implanted area of the active layer wafer. As a result, a main body of the active layer wafer is cleaved and separated via the buried insulating film with the active layer left in the supporting wafer side. Therefore, it becomes possible in the production of the bonded wafer by employing the smart cut method that such a bonded wafer having the active layer including no crystal defect therein is produced by using a high-rate pull-up wafer that can provide a higher throughput and a higher yield than the low-rate pull-up wafer of the prior art. The third invention only requires that the concentration of the boron in the ingot should be increased. This advantageously helps produce the bonded wafer having no crystal defect in the active layer at low cost.

Further, for example, when the oxide film (insulating film) is formed in the active layer wafer, the active layer wafer contains the boron at a high concentration ($9 \times 10^{18}$ atoms/cm$^3$). If the concentration of the impurities in the wafer is high, the rate of oxide film formation can be accelerated. With the aid of this, the throughput in forming the insulating film in the active layer wafer can be further increased. More advantageously, since the solid solubility of boron is higher in SiO$_2$ than in the silicon during the oxidation process of the active layer wafer in this case, the boron contained in the active layer wafer is localized (segregated) into the oxide film. As a result, in the silicon, specifically in the vicinity of the interface to the oxide film, the area turning to be finally the active layer for the SOI structure can have its boron concentration lower than that of the original substrate.

Further, if the p-type impurities are contained in the active layer wafer at a high concentration, the generation of a charged vacancy and the generation of a kink site may be stimulated, respectively. This can accelerate the recovery (re-crystallization) of the crystal defect developed by the ion implantation of hydrogen. Consequently, the damage to the active layer from the ion implantation can be reduced and the high quality of active layer can be achieved.

A preferred concentration of the boron in the active layer wafer is $12 \times 10^{18}$ atoms/cm$^3$ or higher (a specific resistance $\rho \leq 6$ mΩcm). If the concentration of the boron in the active layer wafer is lower than $9 \times 10^{18}$ atoms/cm$^3$ ($\rho > 10$mΩcm), the COP would not be annihilated in dependence on the pulling up condition of the crystal.

Further, if the active layer wafer has satisfied the production condition defined by the specific resistance $\rho$ lower than 10mΩcm, the interstitial oxygen atomic concentration Oi lower than $12 \times 10^{17}$ atoms/cm$^3$ (old ASTM conversion) and the temperature for forming the oxide film (insulating film) higher than 1000° C., then advantageously there would be no more chance for the crystal defect, such as the oxide deposition or the OSF, to be generated even after the cleavage of the active layer wafer. This allows the active layer wafer to be reused.

A seventh invention provides a method for producing a bonded wafer as defined in any one of the first to the sixth invention, in which an annealing process is applied to the active layer wafer or the bonded wafer at 1000° C. or higher temperature for one hour or more in a reducing gas atmosphere containing hydrogen gas after the formation of the insulating film in the active layer wafer or the cleavage and separation of the active layer wafer.

According to the seventh invention, the annealing process is applied to the active layer wafer or the bonded wafer under the predetermined condition after the formation of the insulating film or after the cleavage. This facilitates the outward diffusion of the p-type impurities in the vicinity of the top layer of the active layer wafer or in the active layer and reduces the specific resistance of the active layer, so as to provide the active layer having the thickness in the order of 1 mΩcm to 10 mΩcm which is obtainable from the p-type active layer wafer of the prior art.

The annealing process may be carried out after the formation of the insulating film in the active layer wafer. Alternatively, the annealing process may be carried out after the cleavage of the active layer.

The annealing process with the annealing temperature below 1000° C. and the annealing time shorter than one hour could not provide a satisfactory outward diffusion of the boron, resulting in the boron concentration in the active layer to be higher than a required value. A preferred annealing temperature for the bonded wafer may be in a range of 1100° C. to 1200° C., and a preferred annealing time for the bonded wafer may be in a range of one hour to four hours.

Effect of the Invention

According to the present invention, since an active layer is provided by an epitaxial layer that has been produced by the epitaxial growth and contains no crystal defect, therefore such a bonded wafer that is produced in the smart cut method and has the active layer including no crystal defect can be manufactured at a higher throughput and a higher yield as compared to the case of using a low-rate pull-up wafer of the prior art for the active layer wafer. Further advantageously, since the concentration of impurities in the epitaxial layer is high, therefore in formation of an oxide film or one type of insulating film, the rate of formation of the oxide film can be accelerated. AS a result, the throughput of the bonded wafer can be further increased. More favorably, any damage to the active layer from the ion implantation can be reduced and thus a high quality of the active layer can be obtained.

Further, since the active layer containing boron at a concentration of $9 \times 10^{18}$ atoms/cm$^3$ or higher with no presence of crystal defect has been produced by the epitaxial growth, therefore the bonded wafer that is produced in the smart cut method and has the active layer including no crystal defect can be manufactured at a higher throughput and a higher yield. More advantageously, since the concentration of the impurities in the epitaxial layer is high, the rate of formation of the oxide film (insulating film), for example, can be accelerated. As a result, the throughput of the bonded wafer can be further increased. Still further, any damage to the active layer from the ion implantation can be reduced and thus the high quality of the active layer can be obtained.

Yet further, since simply increasing the concentration of the boron contained in the active layer wafer can eliminate the crystal defect in the active layer, the bonded wafer with no presence of crystal defect in the active layer can be produced favorably at a low cast.

Furthermore, since annealing process is applied to the active layer wafer or the bonded wafer under the predetermined condition after the formation of the insulating film or after the cleavage, the outward diffusion of the p-type impurities in the vicinity of the top layer of the active layer wafer or in the active layer can be promoted. AS a result, a specific resistance of the active layer can be reduced.

DESCRIPTION OF REFERENCE NUMBERALS

10 Active layer wafer
12*a* Silicon oxide film (Insulating film)
13 Active layer
14 Hydrogen ion implanted area (Ion-implanted area)
20 Supporting wafer
30 Bonded wafer
40 Epitaxial layer

DESCRIPTION OF THE PREFERRED EMBODIMENTS

Preferred embodiments of the present invention will now be described with reference to the attached drawings.

First Embodiment

Figure 1:
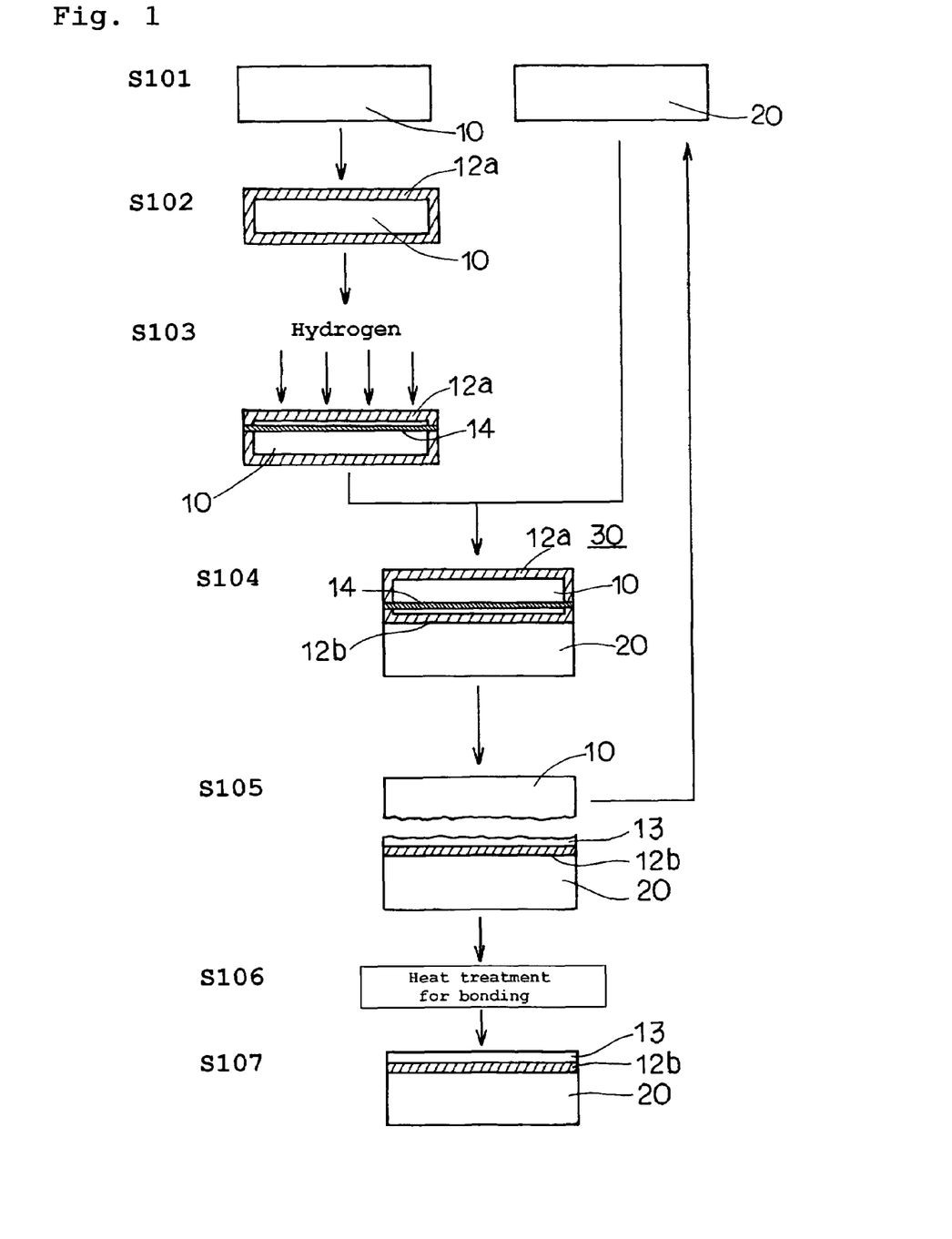
FIG. 1 is a flow sheet showing a method for producing a bonded wafer according to a first embodiment of the present invention.

Firstly, a monocrystal ingot of silicon of p-type that has been doped with boron at a concentration as high as $1 \times 10^{19}$ atmos/cm$^3$ is pulled up in the CZ method as shown in step S101 of FIG. 1. A rate of pulling-up is 1.0 mm/min. A concentration of interstitial oxygen atom, Oi, of the monocrystal ingot of silicon is in a range of $11 \times 10^{17}$ atoms/cm$^3$ to $12 \times 10^{17}$ atoms/cm$^3$. After that, the monocrystal ingot of silicon undergoes a series of processing comprising block cutting, slicing, beveling and mirror polishing. Those steps of processing produce a wafer to be prepared as an active layer wafer 10 of p-type and mirror-polished having a thickness of 725 μm, a diameter of 200 mm and a specific resistance of 9 mΩcm.

On the other hand, a monocrystal ingot of silicon of p-type that has been added with the boron at a low concentration of $1 \times 10^{15}$ atoms/cm$^3$ is pulled up in the Cz method. After that, the monocrystal ingot of silicon undergoes a series of processing comprising block cutting, slicing, beveling and mirror polishing. Those steps of processing produce a wafer to be prepared as a supporting wafer 20 of p-type and mirror-polished having a thickness of 725 μm, a diameter of 200 mm and a specific resistance of 10 Ωcm.

Following that step, the active layer wafer 10 is introduced into a thermal oxidation device, where the thermal oxidation is applied to the active layer wafer 10 in an oxygen gas atmosphere, as shown in step S102 of FIG. 1. This forms a silicon oxide film 12*a* having a thickness of about 0.15 μm entirely across the exposed surface of the active layer wafer 10. The condition of thermal oxidation may be defined by the temperature of 1000° C. and a duration time of 180 minutes.

Subsequently, an intermediate current ion-implanting device is used to perform the ion implantation of the hydrogen with an acceleration voltage of 50 keV into the active layer wafer 10 via its mirror finished surface at a predetermined depth measured therefrom. Thus the hydrogen ion-implanted area 14 is formed in the active layer wafer 10. The dose used in this step is $5 \times 10^{16}$ atoms/cm$^2$.

Subsequently, the active layer wafer 10 and the supporting wafer 20 are bonded together by using the surface of the active layer wafer 10 and the mirror-polished surface of the supporting wafer as the bonding surfaces (the superposed surfaces) via the silicon oxide film 12*a* interposed therebetween with a known jig in a vacuum unit, for example, thus to produce the bonded wafer 30, as shown in step S104 of FIG. 1. In this step, the active layer wafer 10 and the supporting wafer 20 are connected together via the silicon oxide film 12*a* interposed therebetween, which silicon oxide film 12*a* at the junction between the active layer wafer 10 and the supporting wafer 20 defines a buried silicon oxide film (insulating film) 12*b*. Further, in the step of bonding, such a bonding method may be employed in which the surfaces, which have been subjected to the plasma treatment (a treatment to activate the surface by the plasma irradiation), are bonded together in order to improve the bonding strength.

Then, the bonded wafer 30 is introduced into a thermal treatment device for cleavage, though not shown, and heat treated in an atmosphere of nitrogen gas at a furnace temperature of 500° C., as shown in step S105 of FIG. 1. The duration of heat treatment is 30 minutes. This can provide a low-temperature thermal treatment, in which a part of the active layer wafer 10 is cleaved and separated from the bonded wafer 30 at the site of the hydrogen ion-implanted area 14 while leaving the active layer 13 on the bonding interface of the supporting wafer 20. It is also possible to reuse the part of the active layer wafer 10, which has been cleaved off from the bonded wafer 30, as a silicon wafer serving as the supporting wafer 20 for the subsequent manufacturing process.

After the cleavage, the heat treatment for bonding is applied to the bonded wafer 30 at 1100° C. for two hours, as shown in step S106 of FIG. 1. This treatment can enhance the bonding strength between the active layer wafer 10 and the supporting wafer 20.

Following the above step, polishing is applied to the surface of the active layer wafer 13 by using a polishing device, as shown in step S107 of FIG. 1. Thus, the bonded SOI substrate (the bonded wafer) has been produced in the smart cut method.

As discussed above, since the boron is contained in the crystal by such a large amount as $1 \times 10^{19}$ atoms/cm$^3$ during pulling up of the monocrystal ingot of silicon for the active layer wafer, therefore no crystal defect exists in the monocrystal ingot of silicon and thus in the active layer 13.

Since the boron has been added at a high concentration into the monocrystal ingot of silicon in the first embodiment, it becomes possible to pull up the monocrystal ingot of silicon with no presence of crystal defect at such a high pulling-up rate as 1.0 mm/min. As a result, it becomes possible to produce the bonded SOI substrate having the active layer 13 containing no crystal defect at a higher throughput and a higher yield as compared to the case employing a low-rate pull-up wafer for the active layer wafer in the prior art. More advantageously, in the first embodiment, all that is required is to increase the boron concentration in the monocrystal ingot of silicon, and this allows the production of such a bonded SOI substrate at low cost.

Further, in the formation of the silicon oxide film 12a, the rate of forming the silicon oxide film 12 can be accelerated, because the active layer wafer 10 has been previously added with the boron at a high concentration. With the aid of this, the throughput of the bonded SOI substrate can be further improved. More advantageously, during the process of oxidation of the active layer wafer 10, the boron within the active layer wafer 10 is localized (segregated) in the silicon oxide film 12a due to a difference of the solid solubility of boron. As a result, the boron concentration in the active layer 13 can be reduced by about ½. In this case, although the planarization, the film thickness reduction in the top surface of the SOI layer after the cleavage has been carried out by using the polishing, the sacrificial oxidation may be applied instead to thereby reduce the boron concentration further lower.

As described above, if the boron is added to the active layer wafer 10 at a high concentration, the generation of a charged vacancy and the generation of a kink site may be stimulated, respectively, in the silicon of the active layer wafer 10. This can accelerate the recovery of the crystal defect in the active layer wafer 10 developed by the ion implantation of hydrogen. Consequently, the damage to the active layer 13 from the ion implantation can be reduced and the high quality of active layer 13 can be achieved.

Further, the active layer wafer 10 has satisfied the production condition defined by the specific resistance $\rho$ lower than 10 m$\Omega$cm, the interstitial oxygen atomic concentration Oi lower than $12 \times 10^{17}$ atoms/cm$^3$ and the temperature for forming the silicon oxide film 12a higher than 1000° C. Owing to this, there is no chance of generation of the crystal defect, such as the oxygen deposition and the OSF, in the remaining portion of the active layer wafer 10 even after the cleavage. Consequently, reuse of the active layer wafer 10 is made feasible.

It is to be noted that the annealing treatment may be applied to the active layer wafer 10 or the bonded wafer 30 at the temperature not lower than 1000° C. for one hour or more in an atmosphere of hydrogen or other reducing gas, after the formation of the silicon oxide film 12a or after the cleavage. This can facilitate the outward diffusion of the boron in the vicinity of the top layer of the active layer wafer 10 or in the active layer 13. AS a result, the specific resistance of the active layer 13 can be reduced.

Second Embodiment

Figure 2:
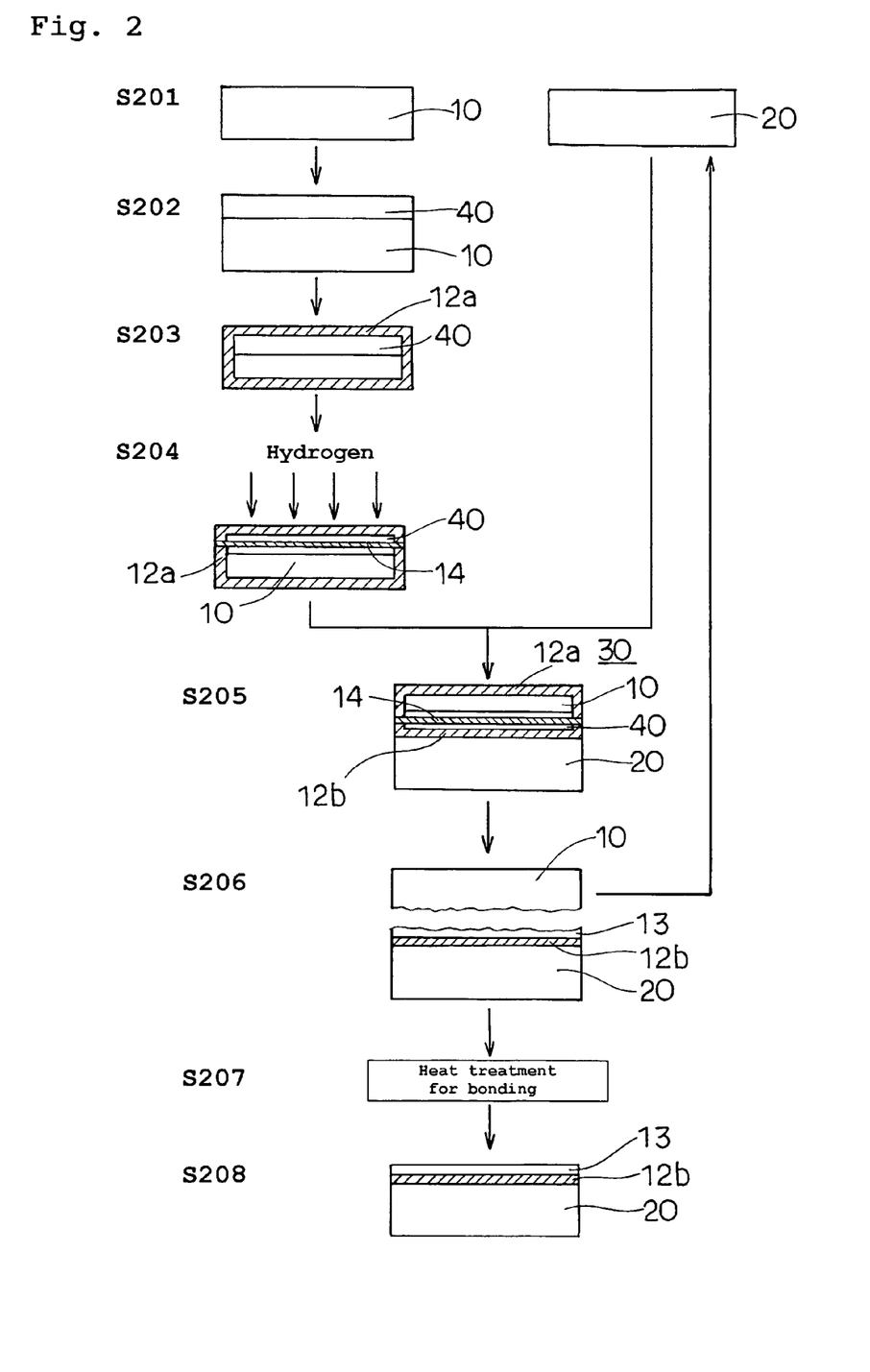
FIG. 2 is a flow sheet showing a method for producing a bonded wafer according to a second embodiment of the present invention.

Turning now to FIG. 2, a method for producing a bonded wafer of a second embodiment will now be described. The second embodiment is characterized in that it is an example that has employed, instead of the active layer wafer 10 with the boron concentration of $1 \times 10^{19}$ atoms/cm$^3$, an active layer wafer 10B comprising a main body containing the boron at a low concentration across the entire bulk thereof and an epitaxial layer 40 consisting of monocrystal silicon containing boron at a high concentration, which grows on the top surface of the main body.

The method for producing the bonded wafer of the second embodiment will be described more specifically below.

Firstly, a monocrystal ingot of silicon of p-type added with boron at a concentration as low as $1 \times 10^{15}$ atmos/cm$^3$ is pulled up in the CZ method as shown in step S201 of FIG. 2. A rate of pulling-up is 1.0 mm/min. After that, the monocrystal ingot of silicon undergoes a series of processing comprising block cutting, slicing, beveling and mirror polishing. Those steps of processing produce a wafer to be prepared as an active layer wafer 10 and a wafer prepared as a supporting wafer 20, respectively, each of p-type and mirror-polished having a thickness of 725 μm, a diameter of 200 mm and a specific resistance of 10 $\Omega$cm.

After the above step, the active layer wafer 10 is introduced into an epitaxial growth system, though not shown, where an epitaxial layer 40 of p$^+$-type and added with the boron by an amount as large as $1 \times 10^{19}$ atoms/cm$^3$ is grown on the mirror-finished surface of the active layer wafer 10.

Specifically, the active layer wafer 10 is loaded on a susceptor arranged in a reaction furnace of the epitaxial growth system, as shown in step S202 of FIG. 2. After that, the $SiHCL_3$ gas (0.1 volume percent diluted by $H_s$ gas) is mixed with the $B_2H_6$ gas (partial pressure in a range of $2 \sim 4 \times 10^{-5}$), and a resultant mixture is supplied into the reaction furnace at a flow rate of 80 litter/min so as for the epitaxial layer 40 to grow on top of the active layer wafer 10. The temperature used for the epitaxial growth is 1100° C. and the duration for the epitaxial growth is two minutes. Thus, the epitaxial layer 40 having the thickness of about 0.6 μm and the specific resistance of 9 m$\Omega$cm can be formed on the surface of the active layer wafer 10.

Subsequently, the active layer wafer 10 is introduced into a thermal oxidation device, where the active layer wafer 10 is subjected to the thermal oxidation process in the atmosphere of oxygen gas, as shown in step S203 of FIG. 2. This process can form the silicon oxide film 12a having the thickness of 0.15 µm entirely over the exposed surface of the active layer wafer 10 including the top surface of the epitaxial layer 40. The condition of thermal oxidation may be defined by the temperature of 1000 °C. and a duration time of 180 minutes.

Subsequently, an intermediate current ion-implanting device is used to perform the ion implantation of the hydrogen with an acceleration voltage of 50 keV into the epitaxial layer 40 at a predetermined depth measured from a top surface thereof, as shown in step S204 of FIG. 2. Thus the hydrogen ion-implanted area 14 is formed in the epitaxial layer 40. The dose used in this step is $5 \times 10^{16}$ atoms/cm$^2$.

Subsequently, the active layer wafer 10 and the supporting wafer 20 are bonded together by using the surface of the active layer wafer 10 and the mirror-polished surface of the supporting wafer as the bonding surfaces (the superposed surfaces) via the silicon oxide film 12a interposed therebetween with a known jig in a vacuum unit, for example, thus to produce the bonded wafer 30, as shown in step S205 of FIG. 2. In this step, the active layer wafer 10 and the supporting wafer 20 are connected together via the silicon oxide film 12a interposed therebetween, which silicon oxide film 12a at the junction between the active layer wafer 10 and the supporting wafer 20 defines a buried silicon oxide film (insulating film) 12b.

Then, the bonded wafer 30 is introduced into a thermal treatment device for cleavage, though not shown, and heat treated in an atmosphere of nitrogen gas at a furnace temperature of 500° C. for a duration time of 30 minutes, as shown in step S206 of FIG. 2. This can provide a low-temperature thermal treatment, in which a part of the active layer wafer 10 is cleaved and separated from the bonded wafer 30 at the site of the hydrogen ion implanted area 14 while leaving the active layer 13 on the bonding interface of the supporting wafer 20.

After the cleavage, the heat treatment for bonding is applied to the bonded wafer 30 at 1100° C. for two hours, as shown in step S207 of FIG. 2. This treatment can enhance the bonding strength between the active layer wafer 10 and the supporting wafer 20.

Following the above step, polishing is applied to the surface of the active layer 13 by using a polishing device, as shown in step S208 of FIG. 2. Thus, the bonded SOI substrate (the bonded wafer) has been produced in the smart cut method.

As discussed above, at the step of cleavage, a part of the active layer 10 is cleaved, while leaving the active layer 13 in the supporting wafer 20 side via the buried silicon oxide film 12b. Thus, it becomes possible in the production of the bonded SOI substrate by employing the smart cut method to produce the bonded SOI substrate having the active layer 13 containing no crystal defect by using a high-rate pull-up wafer that can provides a high throughput and a high yield as compared to a low-rate pull-up wafer of the prior art. More advantageously, all that is required is to increase the boron concentration in the monocrystal ingot of silicon for producing such a bonded SOI substrate. This allows the production of the bonded SOI substrate with no presence of crystal defect in the active layer 13 at low cost.

Other configuration, operation and effect are similar to the first embodiment, and the detailed description thereof is herein omitted.

A report on a result obtained from a comparison and examination with respect to the method in accordance with the present invention and the prior art method, respectively, will be herein presented specifically on BMD (Bulk Micro Defect: internal micro defect) and OSF (Oxidation Induced Stacking Fault) in an active layer wafer after the step of cleavage.

An employed method for evaluation was the light etch evaluation method, in which the active layer wafer was etched after its having been heat treated at 1000° C. for 16 hours. Specifically, this method provides the etching of 2 µm by using an etching solution (HF:HNO$_3$:CrO$_3$:Cu(NO$_3$)$_2$:H$_2$O: CH$_3$COOH=60 cc:30 cc:30 cc:2 g:60 cc:60 cc), and an optical microscope is used to measure a defect. In the evaluation of the BMD/OSF after the cleavage, a value of $5 \times 10^3$/cm$^2$ was used as a reference, wherein a measurement below the value was considered good (o) and a measurement not lower than the value was considered bad ($\chi$). Table 1 shows the result.

TABLE 1

| | B concentration in supporting wafer | Oi concentration in active layer wafer | BOX formation temperature | BMD/OSF evaluation after cleavage |
|---|---|---|---|---|
| Test example 1 | $1 \times 10^{19}$/cm$^3$ (9 mΩcm) | $11 \times 10^{17}$/cm$^3$ | 1000° C. | o |
| Test example 2 | $1 \times 10^{19}$/cm$^3$ (9 mΩcm) | $12 \times 10^{17}$/cm$^3$ | 1000° C. | o |
| Comparative example 1 | $1 \times 10^{19}$/cm$^3$ (9 mΩcm) | $12 \times 10^{17}$/cm$^3$ | 950° C. | X |
| Comparative example 2 | $1 \times 10^{19}$/cm$^3$ (9 mΩcm) | $13 \times 10^{17}$/cm$^3$ | 1000° C. | X |
| Comparative example 3 | $5 \times 10^{18}$/cm$^3$ (15 mΩcm) | $12 \times 10^{17}$/cm$^3$ | 1000° C. | X |

As apparent from Table 1, the test examples 1 and 2, each presenting the result according to the present invention, indicate the BMD/OSF evaluation below the reference value of $5 \times 10^3$ pieces/cm$^2$, which represents the improvement achieved over the comparative examples 1 to 3. The comparative example 1 has been found not appropriate for the purpose of reusing the active layer wafer 10, because it employed the forming temperature of the buried silicon oxide film set below 1000° C. and consequently led to the presence of crystal defect slightly more than the reference value of $5 \times 10^3$ pieces/cm$^2$.

What is claimed is:

1. A method for producing a bonded wafer, comprising:
    growing a silicon epitaxial layer comprising boron having a concentration of $8 \times 10^{18}$ atoms/cm$^3$ to $2 \times 10^{19}$ atoms/cm$^3$ on an active layer silicon wafer;
    forming an insulating film in a surface of said silicon epitaxial layer;
    following said insulating film formation, ion-implanting a light element into said silicon epitaxial layer at a predetermined depth to thereby form an ion-implanted area therein;
    following said ion implantation, bonding said active layer silicon wafer and a supporting wafer together with said insulating film interposed therebetween to thereby form a bonded wafer;
    heat treating said bonded wafer to cause bubbles of light element to be generated in said ion-implanted area and thereby a part of said active layer silicon wafer to be cleaved and separated at the site of said predetermined depth for forming an active layer; and
    after said insulating layer formation on said active layer silicon wafer or said cleavage of the part of said active layer silicon wafer, performing an annealing treatment on said active layer silicon wafer or bonded wafer at a temperature of 1,100° C. to 1,200° C. and for a duration of one hour to four hours in a reducing gas atmosphere comprising hydrogen gas.

2. A method for producing a bonded wafer in accordance with claim 1, in which a thickness of said silicon epitaxial layer is 0.5 μm to 1.5 μm.

3. A method for producing a bonded wafer in accordance with claim 2, in which a thickness of said insulating film is thinner than 0.2 μm.

4. A method for producing a bonded wafer in accordance with claim 1, in which a thickness of said insulating film is thinner than 0.2 μm.

5. A method for producing a bonded wafer in accordance with claim 1, in which a thickness of said silicon epitaxial layer is 1 μm to 2 μm.

* * * * *